US010034097B2

(12) United States Patent
Clerici et al.

(10) Patent No.: US 10,034,097 B2
(45) Date of Patent: Jul. 24, 2018

(54) MEMS ACOUSTIC TRANSDUCER, AND ACOUSTIC TRANSDUCER ASSEMBLY HAVING A STOPPER MECHANISM

(71) Applicant: USound GmbH, Graz (AT)

(72) Inventors: Andrea Rusconi Clerici, Hamburg (DE); Ferruccio Bottoni, Graz (AT)

(73) Assignee: USOUND GMBH, Graz (AT)

( * ) Notice: Subject to any disclaimer, the term of this patent is extended or adjusted under 35 U.S.C. 154(b) by 0 days.

(21) Appl. No.: 15/311,129

(22) PCT Filed: May 13, 2015

(86) PCT No.: PCT/EP2015/060658
§ 371 (c)(1),
(2) Date: Nov. 14, 2016

(87) PCT Pub. No.: WO2015/173333
PCT Pub. Date: Nov. 19, 2015

(65) Prior Publication Data
US 2017/0085994 A1    Mar. 23, 2017

(30) Foreign Application Priority Data
May 14, 2014   (DE) .................. 10 2014 106 753

(51) Int. Cl.
*H04R 25/00* (2006.01)
*H04R 19/00* (2006.01)
(Continued)

(52) U.S. Cl.
CPC ......... *H04R 19/005* (2013.01); *B81B 3/0021* (2013.01); *H04R 17/00* (2013.01);
(Continued)

(58) Field of Classification Search
CPC ...... H04R 19/005; H04R 17/00; B81B 3/0021
(Continued)

(56) References Cited

U.S. PATENT DOCUMENTS 5,804,906 A     9/1998   Tsutsumi
8,607,638 B2 †  12/2013  Jeung
(Continued)

FOREIGN PATENT DOCUMENTS

DE    102012200957 A1    1/2013
DE    102011086722 A1    5/2013
(Continued)

OTHER PUBLICATIONS

German Search Report, dated Oct. 10, 2014.
(Continued)

*Primary Examiner* — Sunita Joshi
(74) *Attorney, Agent, or Firm* — Dority & Manning, P.A.

(57) ABSTRACT

A MEMS sound transducer for generating and/or detecting sound waves in the audible wavelength spectrum includes a membrane carrier, a membrane that is connected in its edge area to the membrane carrier, and may vibrate along a z-axis with respect to the membrane carrier, and a stopper mechanism, which limits the vibrations of the membrane in at least one direction. The stopper mechanism includes at least one reinforcing element, which is arranged on one side of the membrane, and an end stop opposite to the reinforcing element. In a neutral position of the membrane, the end stop is spaced at a distance from the membrane and against which the reinforcing element abuts at a maximum deflection. A sound transducer arrangement includes such a MEMS sound transducer.

15 Claims, 4 Drawing Sheets

(51) Int. Cl.
*H04R 17/00* (2006.01)
*B81B 3/00* (2006.01)
*H04R 23/02* (2006.01)
*H01L 29/84* (2006.01)

(52) U.S. Cl.
CPC ...... *H04R 23/02* (2013.01); *B81B 2203/0127* (2013.01); *H04R 2201/003* (2013.01)

(58) Field of Classification Search
USPC ......... 381/170–175, 163; 257/704, 723, 724, 257/731, 774, 782, 416, 419
See application file for complete search history.

(56) References Cited

U.S. PATENT DOCUMENTS

| | | | |
|---|---|---|---|
| 9,269,831 | B2 | 2/2016 | Ehrenpfordt et al. |
| 2008/0019543 | A1* | 1/2008 | Suzuki ................. H04R 19/005 381/174 |
| 2009/0015108 | A1 | 1/2009 | Ishimasa et al. |
| 2011/0075867 | A1 | 3/2011 | Chung et al. |
| 2011/0085684 | A1 | 4/2011 | Kim et al. |
| 2013/0121509 | A1 | 5/2013 | Hsu et al. |
| 2014/0291786 | A1 | 10/2014 | Zoellin et al. |
| 2015/0230011 | A1* | 8/2015 | Inoue ...................... H04R 1/00 381/162 |
| 2015/0230027 | A1* | 8/2015 | Inoue ..................... H04R 19/00 381/191 |

FOREIGN PATENT DOCUMENTS

| | | |
|---|---|---|
| DE | 102012220819 A1 | 5/2013 |
| JP | 2008-30182 | 2/2008 |
| WO | WO 03/098964 A2 | 11/2003 |
| WO | WO 2015/017979 A1 | 2/2015 |

OTHER PUBLICATIONS

EP International Search Report, dated Sep. 2, 2015.
Translation of International Preliminary Report on Patentability, dated Nov. 24, 2016.
PCT International Search Report, dated Sep. 2, 2015.

\* cited by examiner
† cited by third party

MEMS ACOUSTIC TRANSDUCER, AND ACOUSTIC TRANSDUCER ASSEMBLY HAVING A STOPPER MECHANISM

FIELD OF THE INVENTION

This invention relates to a MEMS sound transducer for generating and/or detecting sound waves in the audible wavelength spectrum, along with a sound transducer arrangement with such a MEMS sound transducer.

BACKGROUND

The term "MEMS" stands for microelectromechanical systems, A MEMS sound transducer for sound generation or a MEMS loudspeaker is known, for example, from DE 10 2012 220 819 A1 Sound is generated by a swivel-mounted membrane of the MEMS loudspeaker. Such sound transducer arrangements are specifically constructed according to the acoustic and other requirements of the respective application area, and consist of a multiple number of different elements. Such sound transducer arrangements can be very small in size, and are therefore installed as loudspeakers and/or microphones, for example, in hearing aids, in-ear headphones, mobile telephones, tablet computers and other electronic devices that offer little installation space.

A MEMS sound transducer for detecting sound waves or a MEMS microphone is known from WO 2015/017979 A1 and U.S. Pat. No. 9,462,389, which is hereby incorporated herein by this reference for all purposes. This MEMS sound transducer is characterized by a stopper mechanism that protects the sensitive membrane from damages that could occur, for example, through the excessive movement of the membrane due to sound pressure or impact. However, the complex structure, which can be manufactured only with great expense, of this stopper mechanism, which comprises a plate with holes and T-shaped stopper elements, is disadvantageous. The plate is arranged in a manner spaced at a distance from the membrane and features a plurality of holes, through which the stopper elements extend with their lower free ends. With the other ends, the stopper elements are fastened to the membrane.

The task of this invention is to provide a MEMS sound transducer with an improved stopper mechanism that is easy to design and manufacture.

SUMMARY OF THE INVENTION

This task is solved by a MEMS sound transducer with the characteristics described below, and by a sound transducer arrangement with the characteristics described below.

A MEMS sound transducer for generating and/or detecting sound waves in the audible wavelength spectrum, with a membrane carrier, a membrane and a stopper mechanism is proposed. The membrane is connected in its edge area to the membrane carrier, and may vibrate along the z-axis with respect to the membrane carrier. The stopper mechanism is formed to limit the vibrations of the membrane in at least one direction. The stopper mechanism includes at least one reinforcing element that is arranged on one side of the membrane. Furthermore, the stopper mechanism comprises an end stop opposite to the reinforcing element, and the end stop is spaced at a distance from the membrane when the membrane is disposed in a neutral position of the membrane and against which the reinforcing element abuts at a maximum deflection of the membrane.

In addition, a sound transducer arrangement, which comprises such a MEMS sound transducer in accordance with the invention, is proposed.

Both the proposed MEMS sound transducer and the proposed sound transducer arrangement offer many advantages compared to the state of the art. Above all, a stopper mechanism is provided, which is simple in design and thus can be manufactured simply and cost-effectively. In particular, no T-shaped stopper elements need to be guided through holes in a plate and connected to the membrane. Rather, the membrane is formed with a reinforcing element that works together with an opposing stop. Thus, by means of the stopper mechanism in accordance with the invention, the sensitive membrane is protected from damages caused by excessive movements of the membrane based on excessive sound pressure or external vibrations or impacts.

In an advantageous additional form of the invention, the MEMS sound transducer comprises a MEMS actuator, which in particular has a carrier substrate, and which works together with the membrane, in order to convert electrical signals into acoustically perceptible sound waves. Of course, it is also possible to convert acoustically perceptible sound waves into electrical signals. The carrier substrate is preferably made of silicon.

It is advantageous if the end stop is at least partially formed on the MEMS actuator, in particular on the carrier substrate of the MEMS actuator, on a housing part and/or on a circuit board. Thus, advantageously, no additional components are required to form the end stop. Alternatively or additionally, the reinforcing element is fastened to the membrane on a side turned towards the MEMS actuator. As a result, upon its abutment, the membrane is protected against the end stop by means of the reinforcing element.

Advantageously, the front surface of the carrier substrate of the MEMS actuator turned towards the membrane is formed as an end stop. In addition or alternatively, it is advantageous if the MEMS actuator, in particular on a side of the carrier substrate turned away from the membrane, features an actuator structure. The actuator structure is preferably formed from a piezoelectric layer.

In an advantageous additional form of the invention, the edge area of the membrane is fastened in a fastening area of the membrane carrier spaced at a distance from the MEMS actuator, in particular from the carrier substrate, preferably in the x-, y- and/or z-direction. Through such decoupling of the membrane suspension from the carrier substrate, the acoustically effective surface of the membrane can be formed to be larger than the carrier substrate.

In an additional advantageous form of the invention, at least one housing part and/or one circuit board forms the membrane carrier, whereas the membrane is preferably fastened between two such components.

It is advantageous if the membrane features an outer elastic area, in particular formed as a bulge. This is preferably arranged adjacent to the edge area. Alternatively or additionally, the membrane features an inner reinforced area, in which the reinforcing element is arranged. The elastic area allows the membrane to vibrate with respect to the membrane carrier. Thus, the inner reinforced area of the membrane, with the reinforcing element, can vibrate with respect to the outer edge area of the membrane and/or its fastening area.

It is also advantageous if the reinforced area and/or the reinforcing element is arranged in a manner adjacent (in particular, directly adjacent) to the elastic area.

In an advantageous additional form of the invention, the reinforcing element can be formed from a plastic, a metal and/or a fiber composite material. It is also advantageous if the reinforcing element is formed with a plate-shaped design, is glued to the membrane, in particular made of silicone, and/or extends over the entire reinforced area. In its reinforced area or through the reinforcing element, the membrane has an increased stiffness and thus better acoustic properties, in particular with regard to achievable loudness, frequency range and/or signal consistency.

In an additional advantageous form of the invention, the reinforcing element features an end stop surface corresponding to the end stop. The end stop surface is preferably formed as a closed frame.

It is preferably provided that the reinforcing element features a coupling surface, which is preferably arranged in the interior of the frame-shaped end stop surface and/or in the area of which the reinforcing element is connected to the actuator structure, in particular indirectly through a coupling element.

Furthermore, it is advantageous if the end stop surface and the coupling surface are spaced at a distance from each other in the z-direction and/or are connected to each other through an intermediate area (in particular, a funnel-shaped intermediate area) of the reinforcing element. As a result, the total area of the membrane is advantageously enlarged without the membrane having a larger diameter, by which installation space and material can be saved—with a simultaneous improvement in the acoustic properties of the membrane.

According to an additional preferred form of the invention, the carrier substrate and the coupling element are produced from the same substrate, in particular a silicon substrate, and in particular feature the same thickness.

In an advantageous additional form of the invention, the stopper mechanism comprises a second end stop, which limits the vibrations of the membrane along the z-axis in a second direction opposite to the first direction, whereas the second end stop preferably is arranged in a sound-conducting channel formed by a housing part. By means of the second end stop, which acts in the direction opposite to the first end stop, the membrane is even better protected against damages.

It is also preferably provided that the two end stops are arranged opposite to each other, and/or the reinforcing element is arranged between such end stops and is spaced at a distance from such end stops.

In an advantageous additional form of the invention, the sound transducer arrangement comprises, in addition to a MEMS sound transducer, a circuit board that features a fully embedded ASIC and/or a recess extending through the circuit board, whereas, preferably, at a first opening of the recess, a MEMS actuator is arranged and/or, at a second opening of the recess, a housing part is arranged, in order to form a closed cavity.

BRIEF DESCRIPTION OF THE DRAWINGS

Further advantages of the invention are described in the following embodiments. The following is shown.

DETAILED DESCRIPTION

In the following description of the figures, in order to define the relationships between the various elements, with reference to the locations of objects shown in the figures, relative terms, such as above, below, up, down, over, under, left, right, vertical and horizontal are used. It is self-evident that such a term may change in the event of a deviation from the location of a device and/or element shown in the figures. Accordingly, for example, in the case of an orientation of a device and/or an element shown inverted with reference to the figures, a characteristic that has been specified as "above" in the following description of the figures would now be arranged "below," Thus, the relative terms are used solely for a more simple description of the relative relationships between the individual devices and/or elements described below.

Figure 1:
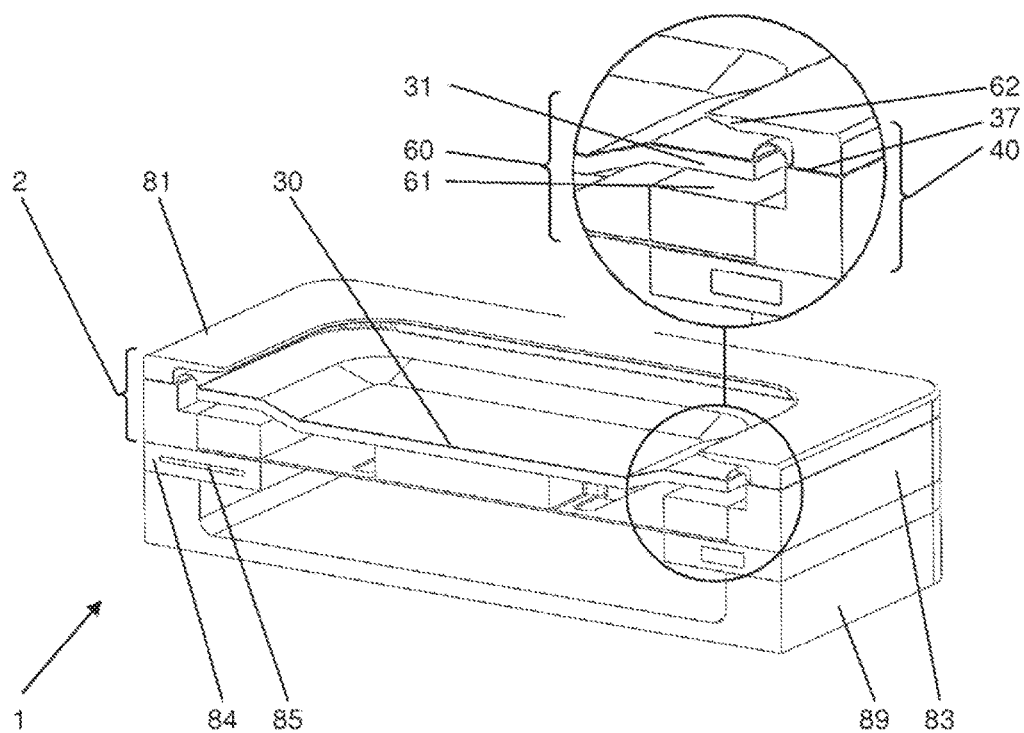
FIG. 1 a first embodiment of the sound transducer arrangement and of the MEMS sound transducer in a view partially in perspective and partially sectional and including an enlarged view of a portion thereof, FIG. 2 the first embodiment of the sound transducer arrangement and the MEMS sound transducer in a schematic lateral sectional view, FIG. 3 the first embodiment of the sound transducer arrangement and the MEMS sound transducer with a membrane that has been swung out in a first direction, in a schematic lateral sectional view.
Figure 2:
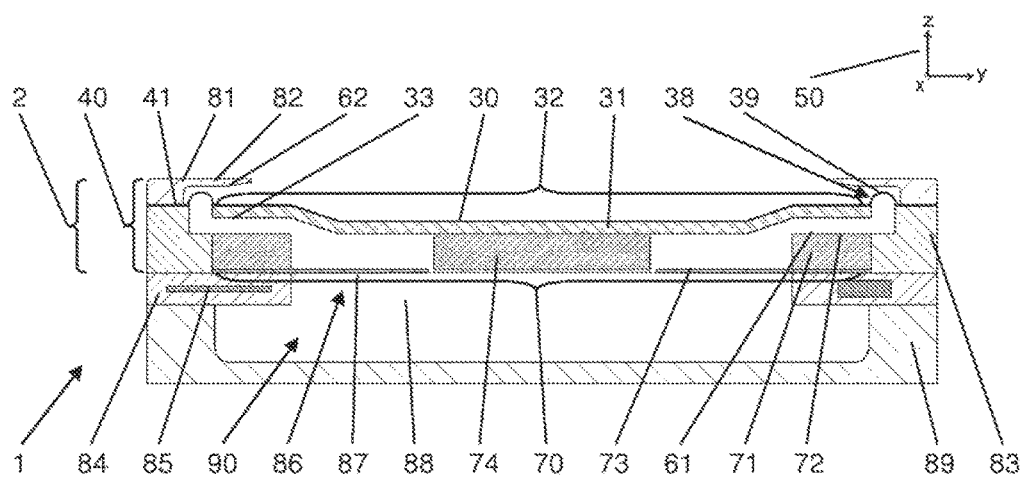
Figure 3:
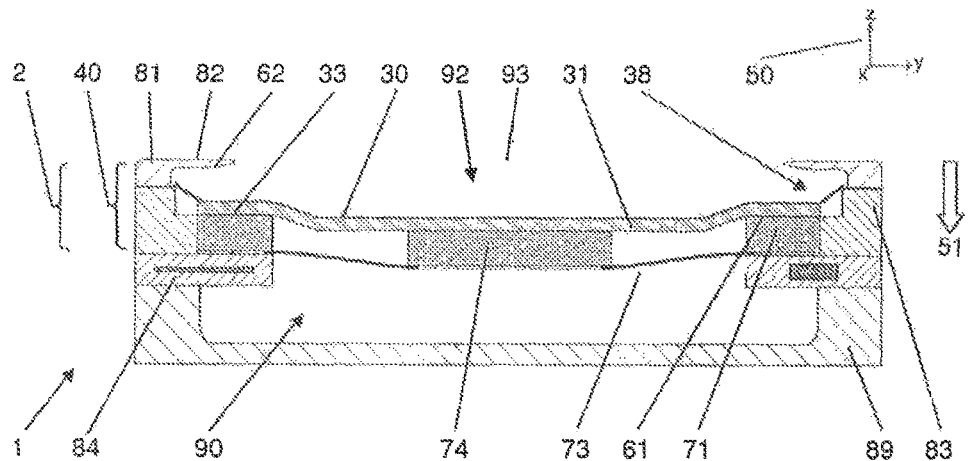
Figure 4:
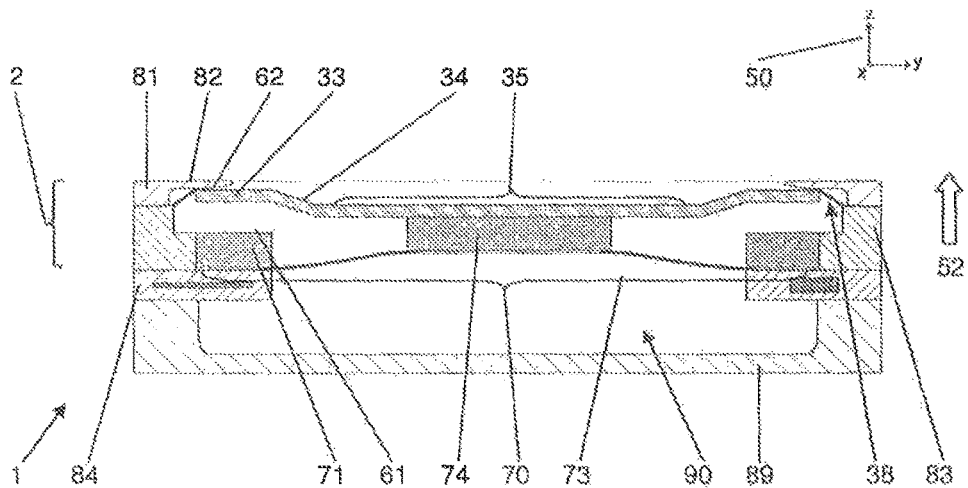
FIG. 4 the first embodiment of the sound transducer arrangement and the MEMS sound transducer with a membrane that has been swung out in a second direction, in a schematic lateral sectional view, FIG. 5 a second embodiment of the sound transducer arrangement and the MEMS sound transducer in a view partially in perspective and partially sectional, FIG. 6 the second embodiment of the sound transducer arrangement and the MEMS sound transducer in a schematic lateral sectional view, and FIG. 7 a third embodiment of the sound transducer arrangement and the MEMS sound transducer in a schematic lateral sectional view.

FIGS. 1 to 4 show a first embodiment of a sound transducer arrangement 1 with a MEMS sound transducer 2 in various views in which the three orthogonal dimensions are indicated by the letters x, y and z in FIGS. 2, 3 and 4 for example. The length dimension y of the transducer arrangement 1 extends along the direction of the arrow pointing to the letter y, while the depth dimension z of the transducer arrangement 1 extends along the direction of the arrow pointing to the letter z. Accordingly, the width dimension x of the transducer arrangement 1 extends along the direction that is normal to the plane of the FIGS. 2, 3 and 4 for example. The MEMS sound transducer 2 is formed for generating and/or detecting sound waves in the audible wavelength spectrum. For this purpose, it has a membrane 30 and a membrane carrier 40. The membrane 30 is connected to the membrane carrier 40 in the edge area 37 of the membrane 30, and is able to vibrate along the z-axis 50 with respect to the membrane carrier 40. At this, the z-axis 50 runs essentially perpendicular to the membrane 30.

The MEMS sound transducer 2 also features a stopper mechanism 60 (FIG. 1), which is formed to limit the vibrations of the membrane 30 in at least one direction schematically represented by the arrow in FIG. 3 designated 51. For this purpose, the stopper mechanism 60 features a reinforcing element 31, which is arranged on one side of the membrane 30, shown here in FIGS. 1-4 on its underside. Additionally, the stopper mechanism 60 includes an end stop 61 disposed to block movement of the reinforcing element 31. The end stop 61 is spaced at a distance from the membrane 30 in a neutral position of the membrane 30, as shown in FIGS. 1 and 2, and against which at least a portion of the reinforcing element 31 abuts at a maximum deflection of the membrane 30 in the direction 51, as shown in FIG. 3.

In this example, the stopper mechanism 60 also comprises a second end stop 62, which limits the vibrations of the membrane 30 along the z-axis 50 in a second direction 52 (schematically shown in FIG. 4) opposite to the first direction 51 (schematically shown in FIG. 3). Moreover, the second end stop 62 is also spaced at a distance from the membrane 30 in a neutral position of the membrane 30, as shown in FIGS. 1 and 2, whereas a portion of the reinforcing element 31 is restrained by the second end stop 62 at a maximum deflection of the membrane 30 in the second direction 52, as shown in FIG. 4. In this case, the membrane 30 is located between the second end stop 62 and the reinforcing element 31.

Consequently, the membrane 30 according to FIG. 3 is swung downwards or deflected downwards, to the extent that the reinforcing element 31 abuts at the first end stop 61, while, according to FIG. 4, the membrane 30 is swung upwards or deflected upwards, to the extent that the reinforcing element 31 is restrained at the second end stop 62 of the stopper mechanism 60.

As is also evident in particular from FIGS. 1 to 4, the two end stops 61, 62 are arranged in a manner opposite to each other, whereas the reinforcing element 31 is arranged between such two end stops 61, 62 and is spaced at a distance from them. At this, the second end stop 62 is arranged on an upper housing part 81, which is arranged above the membrane 30, and in particular in a sound-conducting channel 92 formed by the upper housing part 81.

On the other hand, the first end stop 61 is arranged on a carrier substrate 71 of a MEMS actuator 70 or is formed by one side of the carrier substrate 71. This MEMS actuator 70 is arranged below the membrane 30 and/or is essentially parallel to the membrane 30. The MEMS actuator 70 works together with the membrane 30 to convert electrical signals into acoustically perceptible sound waves or vice versa. For this purpose, the MEMS actuator 70 comprises an actuator structure 73 that is preferably designed to be piezoelectric. Furthermore, the actuator structure 73 is arranged on a side of the carrier substrate 71 facing away from the membrane 30. In this example, the front surface 72 of the carrier substrate 71 of the MEMS actuator 70 facing towards the membrane 30 is formed as an end stop 61. Unlike that shown here, however, the first end stop 61 could also be formed on a housing part, such as the middle housing part 83 and/or on a circuit board, such as the circuit board 84. In the present case, the reinforcing element 31 is fastened to the membrane 30 on the the present case, the reinforcing element 31 is fastened to the membrane 30 on the side facing towards the MEMS actuator 70. In addition or alternatively, the reinforcing element 31 or an additional reinforcing element could, in principle, also be fastened to the membrane 30 on the side facing away from the MEMS actuator 70. In particular as schematically shown in FIGS. 2, 3 and 4, the reinforcing element 31 features surrounding the outer perimeter region thereof an end stop section 33 that is disposed between and free to abut alternately with the end stops 61, 62.

In addition to the membrane 30, the membrane carrier 40, the MEMS actuator 70, and the two housing parts 81, 83 of the MEMS sound transducer 2, the sound transducer arrangement 1 also includes a circuit board 84 and a lower housing part 89. An ASIC 85 is fully embedded in the circuit board 84. In addition to the ASIC, other passive components, such as electrical resistors and/or I/O contacts, may be embedded in and/or arranged on the circuit board.

The circuit board 84 features a recess 86 which extends fully through the depth of the circuit board in the z dimension and has two openings 87, 88, one opening at each of the opposite surfaces of the circuit board 84. The MEMS actuator 70 is arranged at the first opening 87 of the recess 86. The lower housing part 89 is arranged at the second opening 88 of the recess 86 to form a closed cavity 90. Thus, the circuit board 84 is arranged between the MEMS actuator 70 and the lower housing part 89.

The MEMS sound transducer 2, and in particular the MEMS actuator 70, is connected to the ASIC 85 with electrical contacts that are not further shown in the figures. Thus, the MEMS sound transducer 2 can thus be controlled or operated by means of ASIC 85. For example, if the MEMS sound transducer 2 is to function as a loudspeaker, it can be excited by means of the ASIC 85 in such a manner that, through the MEMS actuator 70, the membrane 30 for generating sound energy is vibrated with respect to the membrane carrier 40. The term "cavity" is to be understood as an empty space by means of which the sound pressure of the MEMS sound transducer can be reinforced. Since the cavity 90 is already partially formed by the recess 86 of the circuit board 84, the sound transducer arrangement 1 can be formed in a manner that saves installation space to a high degree, but with a relatively large acoustically effective cavity volume, since the empty space provided by the lower housing part 89 for forming the cavity 90 can now turn out to be smaller. The housing parts 81, 83, and in particular the lower housing part 89, preferably feature a material that is different from the circuit board 84. Alternatively, at least one of the housing parts 81 could also be a component of the circuit board 84.

The sound transducer arrangement 1 has an essentially rectangular basic shape, and is thus simple and cost-effective to manufacture, and is suitable for numerous applications. The sound transducer arrangement 1 is also constructed in a sandwich-like manner; that is, the lower housing part 89, the circuit board 84 and the MEMS sound transducer 2 are arranged in a manner stacked on top of each other. Herein, the MEMS sound transducer 2, the circuit board 84 and the lower housing part 89 ail have the same outer dimensions of length and width. Alternatively, however, the sound transducer arrangement 1 can, in principle, also feature a basic shape (in particular, a round basic shape).

The membrane 30, which consists, in particular, of silicone, is fastened in its edge area 37 in the fastening area 41 of the membrane carrier 40 as shown in FIG. 2, whereas the fastening area 41 is arranged in a manner spaced at a distance from the MEMS actuator 70 and its carrier substrate 71 in the x-, y- and z-directions. In this case, the membrane carrier 40 is formed by the upper housing part 81 and the middle housing part 83, whereas the fastening area 41 is located between the two housing parts 81, 83, and the edge area 37 of the membrane 30 is thus fastened between such two housing parts 81, 83. The membrane carrier 40 is formed with frame-like design and surrounds the membrane 30. Unlike that shown here in FIG. 2, however, the membrane carrier 40 could also be at least partially formed by a circuit board, such as the circuit board 84.

Adjacent to its edge area 37, the membrane 30 features an outer elastic area 38 shown in FIGS. 2, 3 and 4, formed in the present case in particular as a bulge 39, and an inner reinforced area 32, in which the reinforcing element 31 is arranged. At this, the reinforced area 32 or the reinforcing element 31, as the case may be, is arranged immediately adjacent to the elastic area 38. The elastic area 38 allows the membrane 30 to vibrate with respect to the membrane carrier 40, and in particular the inner-reinforced area 32 with respect to the outer edge area 37. In this case, the reinforcing element 31 is made of a metal and/or is formed with a plate-shaped design, whereas, as in the present case, it preferably extends over the entire reinforced area 32 and is glued to the membrane 30. In this case, the end stop section 33 of the reinforcing element 31 that is configured and disposed to interact alternately with the stops 61, 62 is formed with frame-like design and is arranged immediately adjacent to the membrane's elastic area 38, which is likewise formed with frame-like design.

Moreover, the first end stop 61 and the second end stop 62 are formed with frame-like design, in this example corresponding to the end stop section 33 of the reinforcing element 31. At this, the carrier substrate 71, which provides the first end stop 61 on its front surface 72, surrounds the actuator structure 73 in a frame-like manner, while the upper housing part 81 features a projection 82, which surrounds the acoustic inlet/outlet opening 93 of the sound-conducting channel 92 in a frame-like manner and provides the second end stop 62.

In the interior of the frame-shaped end stop section 33, the reinforcing element 31 of the membrane 30 features a coupling section 35 as schematically shown in FIG. 4. At this, the end stop section 33 and the coupling section 35 are spaced at a distance from each other in the z-direction and are connected to each other through an intermediate section 34 of the reinforcing element 31, which in this case is funnel-shaped in this case leading from the end stop section 33 to the coupling section 35. Since the reinforcing element 31 is glued to the membrane 30, the membrane 30 accordingly has a funnel-like shape. In the area of the coupling section 35, the reinforcing element 31 is connected to the actuator structure 73 of the MEMS actuator 70 through a coupling element 74. In the present case, the carrier substrate 71 and the coupling element 74 are produced from the same substrate, in particular a silicon substrate. They also feature the same thickness as measured in the z direction. Unlike the one shown here, alternatively or in addition to the coupling element 74, an adapter element for connecting to the actuator structure 73 can be used.

Figure 5:
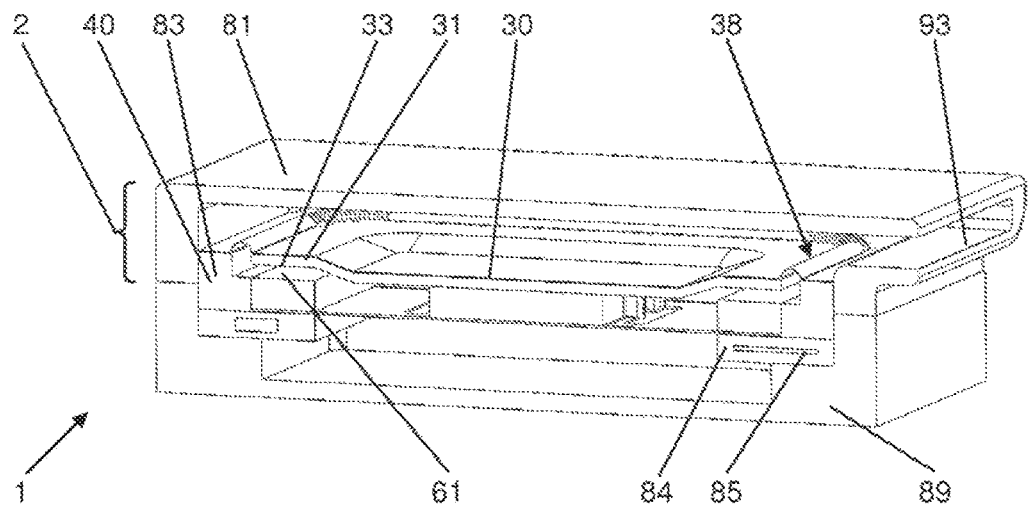
Figure 6:
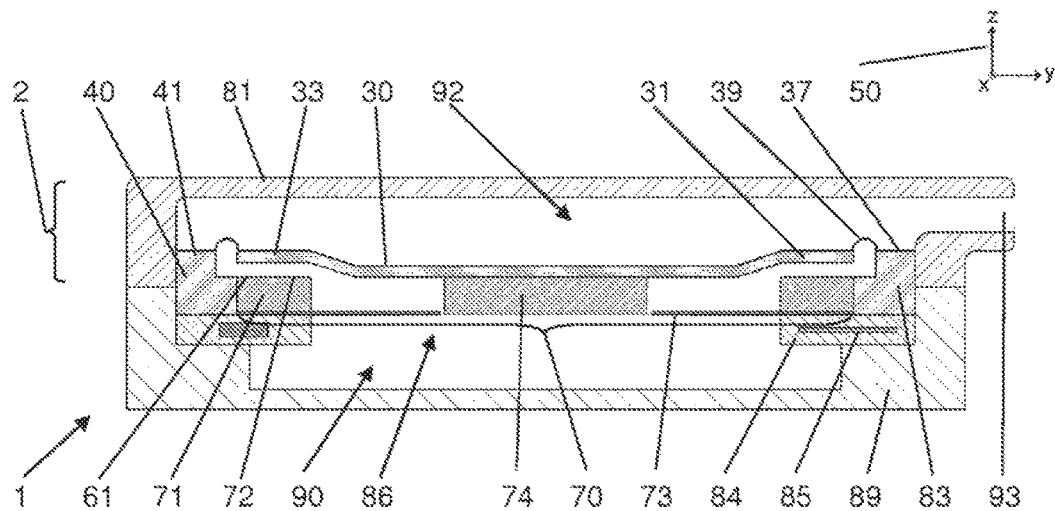
Figure 7:
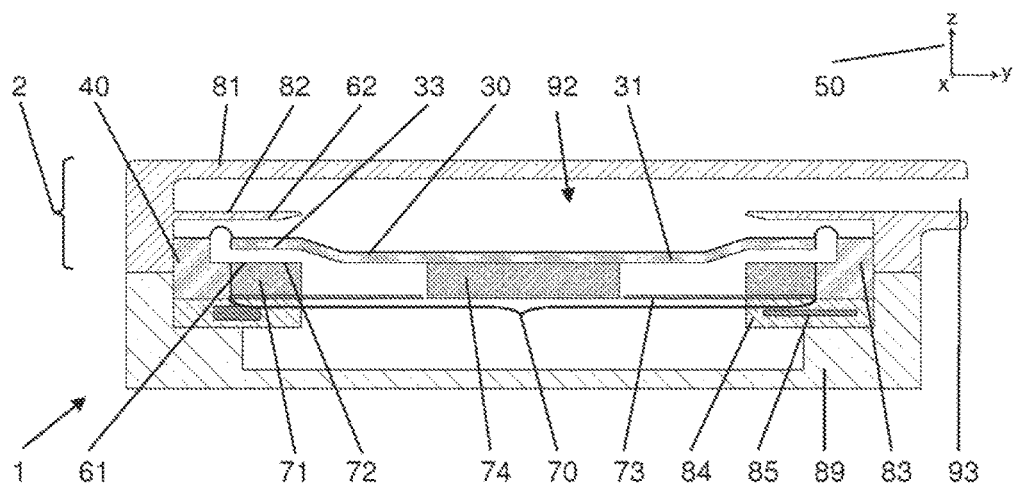

FIGS. 5 to 7 show additional embodiments of the sound transducer arrangement 1 and the MEMS sound transducer 2, whereas, essentially, only the differences with respect to the first embodiment already described are discussed below. Thus, with FIGS. 5 to 7 and the following description of the additional embodiments, the same reference signs are used for characteristics that are identical and/or at least comparable when compared to the first embodiment shown in FIGS. 1 to 4, in terms of their design and mode of action. To the extent that such characteristics are not explained once again in detail, their design and mode of action correspond to the characteristics described above. The differences described below can be combined with the characteristics of the respective preceding and subsequent embodiments.

FIGS. 5 and 6 show a second embodiment of the sound transducer arrangement 1 and the MEMS sound transducer 2 in different views. With the second embodiment, the upper housing part 81 is to be mentioned as a major difference from the first embodiment shown in FIGS. 1 to 4. In this case, the upper housing part 81 forms a sound-conducting channel 92 with an acoustic inlet/outlet opening 93, which is arranged laterally on the outer surface of the MEMS sound transducer 2 or the sound transducer arrangement 1, as the case may be. The housing part 81 provides, in particular, additional protection for the membrane 30, since it provides a cover against the environment.

However, no second end stop is provided in this embodiment; that is, no end stop for the reinforcing element 31 of the membrane 30 is arranged on the upper housing part 81. Furthermore, in this case, the upper housing part 81 is not a component of the membrane carrier 40. The membrane carrier 40 is formed solely by the middle housing part 83, such that the membrane 30 is fastened solely to the middle housing part 83. The upper and lower housing parts 81, 89 have a larger outer diameter in comparison to the first embodiment, by which the base surface of the sound transducer arrangement 1 is enlarged. In addition, in this example, the upper housing part 81 is not arranged on the middle housing part 83, but on the lower housing part 89, and is connected to this, such that such two housing parts 81, 89 together form a housing that surrounds the remaining components of the sound transducer arrangement 1 or the MEMS sound transducer 2, as the case may be.

FIG. 7 shows a third embodiment of the sound transducer arrangement 1 and the MEMS sound transducer 2. With this, the upper housing part 81 within the sound-conducting channel 92 features a projection 82, which is arranged above the membrane 30, and above the reinforcing element 31 of the membrane 30 and forms the second end stop 62.

This invention is not limited to the illustrated and described embodiments. Variations within the scope of the claims, just as the combination of characteristics, are possible, even if they are illustrated and described in different embodiments.

LIST OF REFERENCE SIGNS

1 Sound transducer arrangement
2 MEMS sound transducer
30 Membrane
31 Reinforcing element
32 Inner Reinforced area of the membrane 30
33 End stop section of the reinforcing element 31
34 Intermediate section of the reinforcing element 31
35 Coupling section of the reinforcing element 31
37 Edge area of the membrane 30
38 Elastic area of the membrane 30
39 Bulge of the elastic area 38 of the membrane 30
40 Membrane carrier
41 Fastening area
50 z-axis
51 First direction
52 Second direction
60 Stopper mechanism
61 First end stop
61 First end stop
62 Second end stop
70 MEMS actuator
71 Carrier substrate
72 Front surface
73 Actuator structure
74 Coupling element
81 Housing part
82 Projection
83 Housing part
84 Circuit board
85 ASIC
86 Recess
87 First opening
88 Second opening
89 Housing part
90 Cavity
92 Sound-conducting channel
93 Acoustic inlet/outlet opening

The invention claimed is:

1. MEMS sound transducer for generating and/or detecting sound waves in the audible wavelength spectrum, comprising:
   a membrane carrier;
   a membrane that in its neutral orientation defines a plane and is connected in its edge area to the membrane carrier, the membrane being configured and disposed to undergo vibrations with wavelengths in the human audible range by moving with respect to the membrane carrier back and forth along a z-axis, which extends in a direction that is normal to the plane of the membrane in its neutral orientation; and
   a stopper mechanism, which limits the vibrations of the membrane in at least a first direction along the z-axis;
   wherein the stopper mechanism has at least one reinforcing element that is arranged on one side of the membrane;
   wherein the stopper mechanism has an end stop disposed in opposition to the reinforcing element;
   a MEMS actuator disposed essentially parallel to the membrane and including a carrier substrate, wherein the end stop is defined by at least a portion of the carrier substrate of the MEMS actuator and wherein the reinforcing element is fastened to the membrane on a side of the membrane facing opposed to the MEMS actuator;
   wherein in a neutral position of the membrane, the stopper mechanism is spaced at a distance apart from the membrane; and
   wherein at a maximum deflection of the membrane, the stopper mechanism abuts against the reinforcing element.

2. MEMS sound transducer according to claim 1, wherein the edge area of the membrane is fastened in a fastening area of the membrane carrier spaced at a distance from the carrier substrate of the MEMS actuator in the z-direction.

3. MEMS sound transducer according to claim 1, further comprising a MEMS actuator disposed essentially parallel to the membrane and including a circuit board, wherein the end stop is formed on at least a portion of the circuit board of the MEMS actuator, and wherein the reinforcing element is fastened to the membrane on a side of the membrane facing toward the MEMS actuator.

4. MEMS sound transducer according to claim 1, further comprising:
   a MEMS actuator disposed essentially parallel to the membrane; and
   a housing part wherein the end stop is formed on at least a portion of the housing part, and the reinforcing element is fastened to the membrane on a side facing towards the MEMS actuator.

5. MEMS sound transducer according to claim 1, further comprising:
   a MEMS actuator disposed essentially parallel to the membrane on a side of the carrier substrate facing away from the membrane, the MEMS actuator including an actuator structure; and
   wherein the carrier substrate defines a front surface of turned towards the membrane and forming the end stop.

6. MEMS sound transducer according to claim 1, further comprising at least one housing part and wherein at least one housing part and the membrane is fastened between the at least one housing part and the membrane carrier.

7. MEMS sound transducer according to claim 1, wherein the membrane defines an inner reinforced area that is connected to the reinforcing element, and wherein the membrane defines an outer elastic area formed as a bulge and disposed to span between the inner reinforced area and the edge area that is connected to the membrane carrier.

8. MEMS sound transducer according to claim 7, wherein the reinforcing element is defined as a flat plate formed from a metal and wherein only the entire inner reinforced area of the membrane is glued to the membrane.

9. MEMS sound transducer according to claim 1, wherein the reinforcing element defines an end stop section that is configured and disposed to engage the end stop, wherein the reinforcing element further defines a coupling section spaced apart in the z-direction from the end stop section and connected to the end stop section via an intermediate section of the reinforcing element such that the reinforcing element imposes a funnel-shape on the membrane.

10. MEMS sound transducer according to claim 9, further comprising:
    a MEMS actuator disposed essentially parallel to the membrane on a side of the carrier substrate facing away from the membrane, the MEMS actuator including an actuator structure; and
    a coupling element that is disposed between the actuator structure and the coupling section of the reinforcing element and connects the actuator structure to the coupling section of the reinforcing element.

11. MEMS sound transducer according to claim 1, wherein the carrier substrate and the coupling element are produced from the same substrate, which is formed of silicon, and are defined by the same thickness dimension in the z-direction.

12. MEMS sound transducer according to claim 1, further comprising:
    a housing part forming a sound-conducting channel;
    a second end stop configured and disposed to limit the vibrations of the membrane along the z-axis in a second direction opposite to the first direction; and
    wherein the second end stop is disposed in the sound-conducting channel formed by the housing part.

13. MEMS sound transducer according to claim 12, wherein the two end stops are arranged opposite to each other and the reinforcing element is arranged between such end stops and is spaced at a distance from such end stops when the membrane assumes the neutral position of the membrane.

14. Sound transducer arrangement, comprising:
    a MEMS sound transducer including:
      a membrane carrier;
      a membrane that in its neutral orientation defines a plane and is connected in its edge area to the membrane carrier, the membrane being configured and disposed to undergo vibrations by moving with respect to the membrane carrier back and forth along a z-axis, which extends in a direction that is normal to the plane of the membrane in its neutral orientation; and
      a stopper mechanism, which limits the vibrations of the membrane in at least one direction;
      wherein the stopper mechanism has at least one reinforcing element that is arranged on one side of the membrane;
      wherein the stopper mechanism has an end stop disposed in opposition to the reinforcing element;
      a MEMS actuator disposed essentially parallel to the membrane and including a carrier substrate, wherein the end stop is defined by at least portion of the carrier substrate of the MEMS actuator and wherein the reinforcing element is fastened to the membrane on a side of the membrane facing opposed to the MEMS actuator;

wherein in a neutral position of the membrane, the stopper mechanism is spaced at a distance from the membrane; and wherein at a maximum deflection of the membrane, the stopper mechanism abuts against the reinforcing element.

15. Sound transducer arrangement according to claim 14, wherein a circuit board includes a fully embedded ASIC and a recess extending through the circuit board in the z-direction, wherein the recess defines a first opening of the recess at which a MEMS actuator is disposed and wherein the recess defines a second opening at which a housing part is disposed so as to form a closed cavity.

* * * * *

UNITED STATES PATENT AND TRADEMARK OFFICE
CERTIFICATE OF CORRECTION

PATENT NO. : 10,034,097 B2
APPLICATION NO. : 15/311129
DATED : July 24, 2018
INVENTOR(S) : Andrea Rusconi Clerici Beltrami et al.

It is certified that error appears in the above-identified patent and that said Letters Patent is hereby corrected as shown below:

On the Title Page

Item (72):
"Andrea Rusconi Clerici, Hamburg (DE)."
Should read:
"Andrea Rusconi Clerici Beltrami, Wien, (AT)."

Signed and Sealed this
First Day of October, 2019

Andrei Iancu
*Director of the United States Patent and Trademark Office*